United States Patent [19]

Goettler et al.

[11] 4,144,588
[45] Mar. 13, 1979

[54] CCD STORAGE MODULE

[75] Inventors: Ernst Göettler, Munich; Otto Grüter, Krailling, both of Fed. Rep. of Germany

[73] Assignee: Siemens Aktiengesellschaft, Berlin & Munich, Fed. Rep. of Germany

[21] Appl. No.: 874,200

[22] Filed: Feb. 1, 1978

[30] Foreign Application Priority Data

Feb. 4, 1977 [DE] Fed. Rep. of Germany ....... 2704711

[51] Int. Cl.$^2$ .............................................. G11C 11/40
[52] U.S. Cl. .................................... 365/183; 365/45; 357/24; 307/304
[58] Field of Search ..................... 365/45, 183; 357/24; 307/238, 304

[56] References Cited

U.S. PATENT DOCUMENTS

3,958,210  5/1976  Levine ................................. 365/183
3,967,254  6/1976  Kosonocky et al. ................. 365/183

Primary Examiner—Terrell W. Fears
Attorney, Agent, or Firm—Hill, Gross, Simpson, Van Santen, Steadman, Chiara & Simpson

[57] ABSTRACT

A CCD storage module has storage positions which are arranged in cascade and which are formed with the aid of electrodes arranged in insulated fashion above a semiconductor substrate. In respect of each storage position, an item of information, incoming as a binary number comprising n bits, is stored in that a quantity of charge composed of small i unit charges is stored in respect of each storage position, where i corresponds to the value of the binary number of the information. For analysis of the quantity of charge eminating from the last storage position of the cascade of storage positions, in a cascade with the last storage position $(2^n - 1)$ additional electrodes are arranged in insulated fashion above the semiconductor substrate, the surface of these additional electrodes and the voltage connected thereto are such that each additional electrode stores one connected thereto are such that each additional electrode stores one unit charge, so that with an incoming quantity of charge of i unit charges, the i additional electrodes which follow the last storage position each store one unit charge. All of the additional electrodes are joined by a common surrender electrode which is driven by a surrender pulse train and the surrender electrode is joined by $(2^n - 1)$ diffusion zones which are isolated from one another in the semiconductor substrate and to which the unit charges stored by the additional electrodes can be transmitted. The additional diffusion zones are connected to an analysis circuit which establishes whether and into which additional diffusion zones a unit charge has been transmitted, and which emits a binary number at its output in accordance with the number of unit charges.

8 Claims, 6 Drawing Figures

CCD STORAGE MODULE

BACKGROUND OF THE INVENTION

1. Field of the Invention

The present invention relates to a charge coupled device storage module, hereinafter called a CCD storage module, having storage positions which are arranged in cascade and which are formed with the aid of electrodes arranged in insulated fashion above a semiconductor substrate, and more particularly to such a module in which, in respect of each storage position, an item of information incoming as a n-digit binary number is stored in that a quantity of charge consisting of i unit charges is stored in respect of each storage position, where i corresponds to the value of the binary number of the information.

CCD memories or charge shift arrangements are well known in the art (e.g., "Electronics," June 21, 1971, page 58ff, and the "Bell System Technical Journal," Vol. 940, Edition 4/1970 pages 587-593). These arrangements fundamentally consist of a semiconductor substrate, and electrically insulating layer applied thereto, and electrodes applied to the insulating layer. The electrodes are electrically isolated from one another. The principle of the CCD storage is based upon the connection of suitably selected voltages to the electrodes in order to produce favorable potential conditions at the boundary surface between the insulating layer and the semiconductor substrate, in which minority charge carriers can be stored. A special write-in device feeds minority charge carriers into these potential wells at a suitable point of time or blocks the inflow of minority charge carriers as determined by the particular item of information to be written in. Thus, charge shift arrangements of this type are particularly suitable for use in shift registers.

It is also known in the art to employ charge shift arrangements as memories. For this purpose, at the beginning of the charge shift arrangement which is constructed as a shift register and in the following will be referred to as a storage field, there is provided an input stage, and at the output of the storage field there is provided an output stage, and between the output stage and the input stage of the storage field there is provided a regenerator stage. This type of construction can be referred to as a storage loop. As the individual storage positions of a storage loop of this kind are only able to store the information for a specific length of time, the stored item of information constantly circulates. In doing so, it is also fed across the regenerator stage and thus regenerated during each cycle.

In the development of CCD stores, it is desirable to achieve as great as possible a storage density upon a semiconductor substrate. Several methods by which this goal can be achieved have already been proposed.

The first method resides in structure reduction. This method is fundamentally the aim of the technological development.

A second method consists in circuitry measures. For example, the E/B principle described in the "IEEE Journal of Solid State Circuits," February 1976, Vol. SC-11, No. 1, Section C on pages 8 and 9, which is applied to a storage field arranged in accordance with the SPS principle is based on these lines.

A further method is likewise described in the above-quoted publication, in which it is stated that it should also be possible to store more than one bit per storage cell in a CCD store. This principle is referred to as multi-level storage (MLS). With this principle, the property of CCD arrangements is exploited to enable the processing of analog signals. In order, for example, to be able to store a four-digit binary number, 16 different charge values are required. In accordance with binary signal occurring in parallel form on, for example, four lines (in accordance with four bits of the binary number ), 0, 1, 2, ... 14 or 15 times a suitable selected charge unit, which in the following will be referred to as a unit charge, is input into the CCD storage field. A decoder circuit of appropriate construction is required for this purpose. An evaluator circuit at the output of the CCD storage field must establish the size of the incoming quantity of charge and reconvert this 1-out-of-16 signal into the four bit signal. The information is then returned in this form to the input of the storage field, thus to the decoder circuit.

Therefore, if a n-digit binary number is to be stored beneath a storage position of a CCD storage module, a quantity of charge composed of i unit charges must be transmitted to this storage position where i corresponds to the value of the binary number of the information. Here, $i \leq (2^n - 1)$.

It is also advantageous to transmit a basic charge of, for example, the magnitude of the unit charge in addition to the quantity of charge corresponding to the information. This basic charge serves to avoid transmission losses arising from surface states on the semiconductor substrate. In this case $2^n$ charge levels are passed through the store, the basic charge and, in dependence upon the information, up to $(2^n - 1)$ further charge levels.

SUMMARY OF THE INVENTION

The object of the present invention is to provide an arrangement with the aid of which, in a CCD storage module operating in accordance with the MLS principle, the quantity of charge corresponding to a binary number is withdrawn from the last storage position of the storage field, is evaluated, and reconverted into the binary signal corresponding to the binary number.

This object is realized in that for the analysis of the quantity of charge eminating from the last storage position of the storage field, in cascade with the last storage position, $(2^n - 1)$ additional electrodes are arranged in insulated fashion above the semiconductor substrate, that the surfaces of these additional electrodes and the magnitude of the d.c. voltage connected to these additional electrodes is such that each additional electrode can store one unit charge, so that with an incoming charge quantity of i unit charges, the i additional electrodes which follow the last storage position each store one unit charge. All of the additional electrodes are connected by a surrender electrode which is driven by a surrender pulse train and the surrender electrode is connected by $(2^n - 1)$ additional diffusion zones which are isolated from one another in the semiconductor substrate and to which the unit charges stored by the additional electrodes can be transmitted. The additional diffusion zones are connected to an analysis circuit which establishes whether and into which additional diffusion zones a unit charge has been transmitted, and which emits the binary number at its outputs in accordance with the number of unit charges.

It is advantageous, at the end of the cascade of additional electrodes, to arrange a diffusion zone in the semiconductor substrate into which the superfluous charge can flow.

Between the additional electrodes there can be arranged transfer electrodes which are all connected to the same d.c. voltage. This insures that the quantity of charge exceeding a unit charge in each case reaches the particular adjoining additional electrode.

The analysis circuit can consist of a flip-flop circuit and a coder circuit. The flip-flop circuit is connected to the additional diffusion zones. Each individual flip-flop of the flip-flop circuit is set when the assigned additional diffusion zone contains a unit charge, but is not set when the assigned additional diffusion zone contains no unit charge. Therefore, the individual flip-flops of the flip-flop circuit indicate the additional diffusion zones or additional electrodes into which a unit charge has been transmitted. The outputs of the flip-flop circuit are connected to the coder circuit which again produces the binary number corresponding to the charge quantity in accordance with the state of the flip-flops of the flip-flop circuit.

It is also advantageous to supply the second inputs of the flip-flops with a reference voltage which has been produced by an arrangement likewise arranged on the CCD storage module.

If a basic charge is transmitted with the i unit charges, a further additional electrode for the basic charge is arranged between the last storage position of the storage field and the first additional electrode for a unit charge. In this case a further additional diffusion zone is required to which the basic charge is transmitted

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
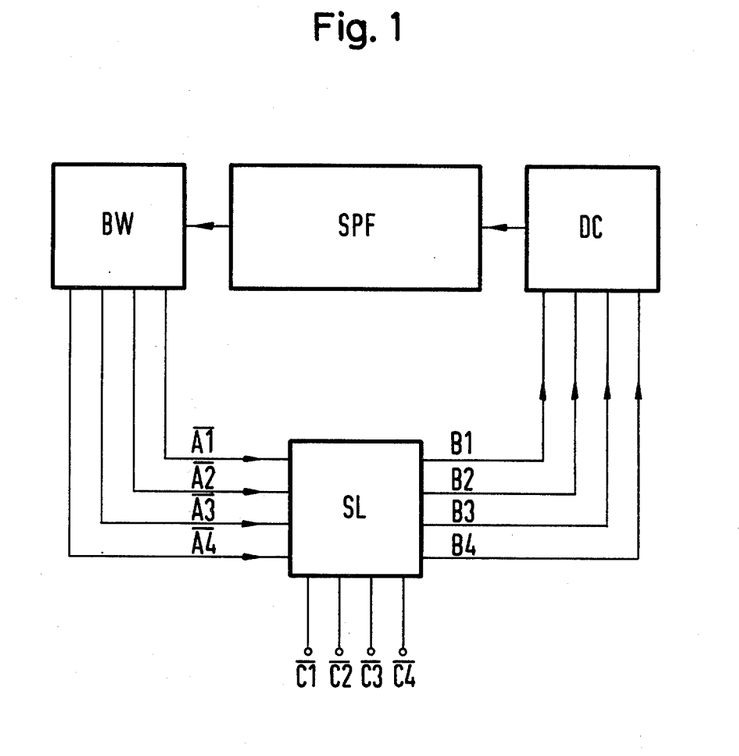
FIG. 1 is a block circuit diagram of a CCD store for MLS operation.

Referring to FIG. 1, a block circuit diagram of a CCD store is illustrated which operates in accordance with the MLS principle. A CCD store of this kind consists of a storage field SPF which can be constructed in a well known manner, for example as described in the "IEEE Journal of Solid Stage Circuits," February 1976.

In order to be able to input information into the storage field SPF, and in fact in MLS operation, a decoder circuit DC is required. The decoder circuit DC is supplied with the binary number by way of a plurality of lines B1 to B4. The decoder DC converts this binary number from, in the exemplary embodiment, four bits into a corresponding quantity of charge in accordance with the MLS principle. This quantity of charge is fed to the first storage position of the storage field SPF. A suitable design for the decoder circuit can be obtained, for example, from the concurrently filed application, Ser. No. 874,206, assigned to the same assignee as the present invention.

When the quantity of charge has been transferred to the storage field SPF, the charge is passed in a known manner through the storage field and reaches the evaluator circuit BW. The evaluator circuit BW is constructed as follows.

The evaluator circuit BW recovers the quantity of charge eminating from the storage field SPF into the binary number and forwards the binary number at its outputs $\overline{A1}$ to $\overline{A4}$ to a switch arrangement SL. The switch arrangement is able to return the binary signal via the lines B1 to B4 to the decoder circuit DC or to forward the binary signal via the lines $\overline{C1}$ to $\overline{C4}$. By way of the lines $\overline{C1}$ to $\overline{C4}$ information can also be input to the CCD store. In this case, the switch arrangement SL switches through the lines $\overline{C1}$ to $\overline{C4}$ via the lines B1 to B4 to the decoder circuit DC.

On the drawings, lines are referenced with upper case letters B, $\overline{A}$, $\overline{C}$, and the signals on these lines are referenced with corresponding lower case letters b, $\overline{a}$, $\overline{c}$.

In the following the fundamental construction of the evaluator circuit BW will be described making reference to FIG. 2, where the last storage position of the CCD storage field is referenced ST. After a transfer electrode E with the timing signal T1, the last storage position ST is followed by a cascade of additional electrodes, EZ, the number of which is $2^n - 1$ (in the exemplary embodiment it has been assumed that n = 4), where n is the number of bits of the binary number. The additional electrodes are arranged in insulated fashion above a semiconductor substrate SU. The d.c. voltage S2 is connected to the additional electrodes EZ. Transfer electrodes ET are arranged between the additional electrodes EZ and are connected to the d.c. voltage S1.

The electrically active surface of the additional electrodes EZ and the voltage S2 connected to the additional electrodes EZ are selected to be such that only one unit charge can be stored beneath each additional electrode. Therefore, if a quantity of charge consisting of i unit charges is transferred from the last storage position ST, the first i additional electrodes EZ which follow the last storage position will in fact hold one unit charge. The other $(2^n - i - 1)$ additional electrodes EZ will not store a unit charge. It is advantageous to maintain the voltage S1 constant at the value of the timing signal T1 and to select the value of the voltage S2 to be somewhat greater than the voltage S1. The transfer electrode E which is supplied with the timing signal T1 serves to supply the quantity of charge present beneath the storage position ST to the additional electrodes EZ. The value of T1 can be 6 V, for example, and the value of the voltage S2 can be 7 V.

At the end of the cascade of additional electrodes EZ, a diffusion zone DF which is connected to the operating voltage VDD is arranged in the semiconductor substrate. The diffusion zone DF is required to be able to receive any superfluous charge. This is the case when, for example, as a result of thermal generation, more charges have been produced than corresponds to $(2^n - 1)$ unit charges.

If in addition to the unit charges, a basic charge is passed through the storage field, between the transfer electrode E and the next transfer electrode ET there is arranged a further additional electrode EZO beneath which the basic charge is stored. The surface of the further additional electrode EZO is dependent upon the magnitude of the basic charge. If the basic charge is equal to the unit charge, the surface of the further additional electrode is equal to the surface of the additional electrodes EZ. This is the case in the present exemplary embodiment.

Beneath the additional electrodes EZ and EZO and the transfer electrodes ET there is entered a curve KZ which indicates the potential conditions beneath the electrodes EZ, EZO and ET. The shaded areas in the curve KZ are to indicate that a unit charge is stored beneath the assigned additional electrodes EZ. If, for example, a charge quantity of eight unit charges arrives from the last storage position ST, one unit charge is stored beneath each of the first eight additional electrodes EZ, EZO. The remaining additional electrodes EZ do not have unit charges stored therebeneath.

The additional electrodes EZ and the transfer electrodes ET are adjoined by a surrender electrode EG which is common to all the additional electrodes EZ, EZO. The surrender electrode EG is supplied with a timing signal S3. Additional diffusion zones DFZ, which are isolated from one another and the number of which corresponds to the number of additional electrodes EZ are arranged adjacent the surrender electrode EG. These additional diffusion zones DFZ are arranged in such a manner that the unit charge stored by the additional electrodes EZ can be transmitted to the assigned additional diffusion zone DFZ and, in fact, whenever the surrender timing signal S3 is connected to the surrender electrode EG. The first additional diffusion zone DFZ0 receives the basic charge which is not used for analysis. This zone is connected to the operating potential VDD and in the following will be referred to as the further additional diffusion zone.

The additional diffusion zones DFZ1 to DFZ 15 are now followed by the analysis circuit which consists of a flip-flop circuit FS and a coder CD. The analysis circuit establishes how many unit charges have been transmitted to the additional diffusion zones DFZ1 to DFZ15 and reproduces the binary number in accordance with the number of unit charges. The flip-flop circuit FFS consists of individual flip-flops FF which are all of identical construction. The number of flip-flops is ($2^n-1$). The reason for this is that no analysis by a flip-flop is required if there is no further charge in addition to the basic charge and thus the binary number is "0." Each flip-flop FF has one input connected to an additional diffusion zone DFZ, and another input connected to a reference voltage VR. Whenever a unit charge has been transferred into an additional diffusion zone DFZ, the associated flip-flop FF is set, i.e. a signal appears at its output Q. If, on the other hand, the assigned additional diffusion zone DFZ contains no unit charge, the flip-flop is not set and a signal appears at its output $\overline{Q}$. The output Q is referred to as the non-inverting output and the $\overline{Q}$ is referred to as the inverting output. Therefore, the position of the flip-flop FF indicates whether or not a unit charge has been transferred into the assigned additional diffusion zone DFZ. Therefore, it can be gathered from the number of set flip-flops FF how many unit charges are contained in a charge quantity which characterizes a binary number.

It is advantageous to produce the reference voltage VR with the aid of an arrangement which is likewise arranged on the semiconductor substrate. FIG. 2 illustrates a possible construction of such an arrangement. This arrangement is referenced DU. The arrangement DU comprises a diffusion zone in the semiconductor substrate, which zone is connected to a current source ID. The diffusion zone is adjoined by a first electrode E1 which is connected to a constant voltage UC. Adjacent the electrode E1 is an electrode E2 which is connected to a fixed voltage UD. The electrode E2 is adjoined by two further electrodes E3 and E4 which are operated by the timing signals T1 and T2. Finally, beside the electrode E4 there is arranged a fifth electrode E5 which is driven by this surrender signal S3. The electrode E5 forms the transition to a further diffusion zone from which the reference VR is withdrawn. The magnitude of the reference voltage is determined by the size of the electrically active surface of the electrode E2 and by the voltage difference between the voltages UD and UC. The magnitude of the reference voltage VR must be such that it lies between the voltage connected to the additional diffusion zones DFZ, which corresponds to a unit charge, and the voltage corresponding to no unit charge. The remaining electrodes E3, E4 and E5 serve to transfer the quantity of charge formed by the electrode E2 to the diffusion zone from which the reference voltage VR is withdrawn. The production of the reference voltage VR in the manner described above has the advantage that fluctuations in threshold voltage and pulse train voltage in the arrangement DU have the same effect as with the other components arranged on the semiconductor substrate.

The coder circuit CD contains n output lines each assigned to one bit position of the binary number, and in the exemplary embodiment contains four output lines $\overline{A1}$ to $\overline{A4}$. Each of the output lines A is connected to an operating voltage potential VDD by way of a MOS transistor MR which is connected as a resistor. Furthermore, each of the output lines $\overline{A}$ is connected to series circuits composed of two MOS transistors MS1 and MS2. Here, the control input of the first transistor MS1 of a series circuit is connected to the non-inverting output Q of the p · k-th flip flop. Here, k indicates that digit value of the bit position of the binary number assigned to the output line and p is the number of the odd-numbered flip-flop (p = 1, 3, 5 . . . ). The control input of the second MOS transistor MS2 in the series circuit is connected to the inverting output $\overline{Q}$ of the Z · k-th, adjacent flip flop. Here, Z is the number of the even-numbered flip-flop FF (Z = 2, 4, 6 . . . ). The flip-flops FF are counted from the flip-flop assigned to the additional electrode EZO which follows the further additional electrode EZO. This is the flip-flop FF1. If the number of the flip-flops FF is such that a series connection is no longer possible due to the absence of a Z-th flip-flop, whereas a p-th flip-flop is in fact provided, only the first MOS transistor MS1 is connected to the p-th flip-flop.

Figure 2:
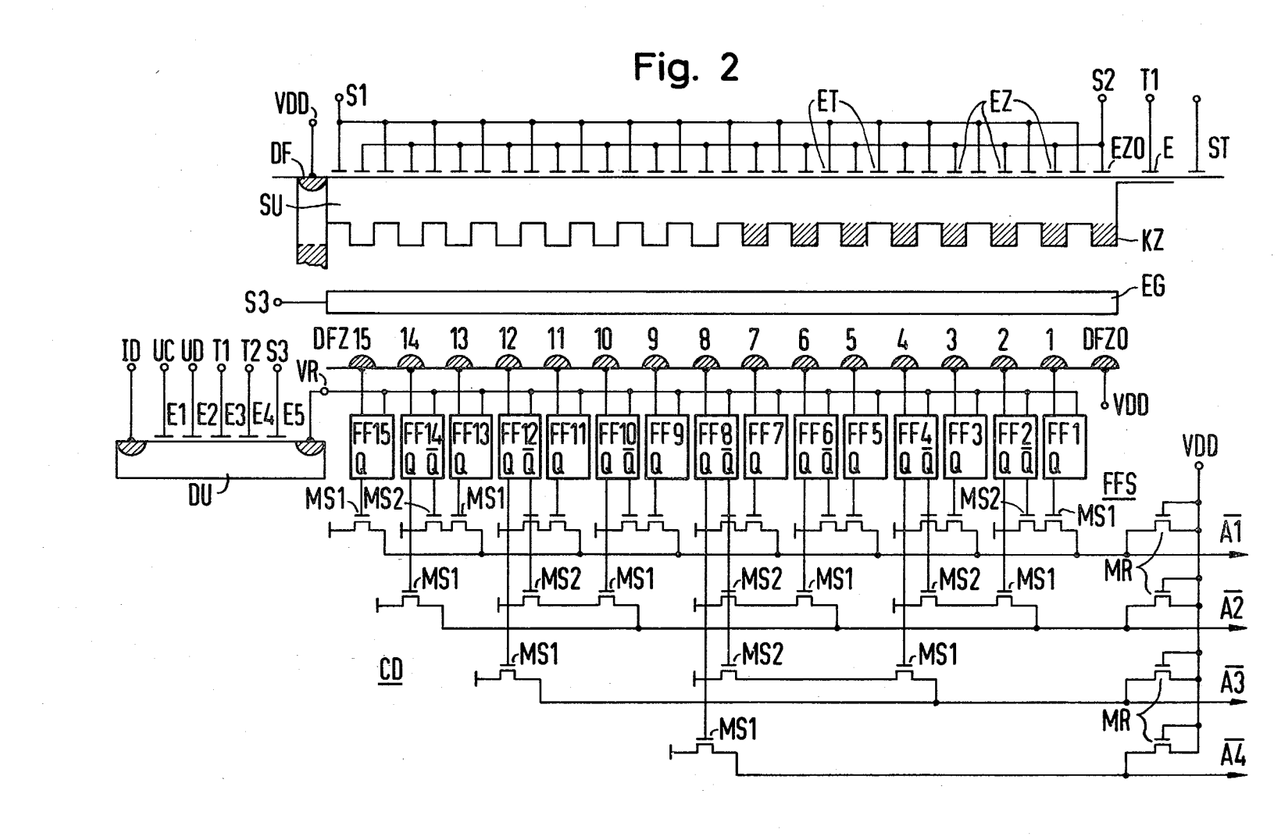
FIG. 2 is a schematic circuit diagram of an evaluator circuit.

In the exemplary embodiment illustrated in FIG. 2, the output line $\overline{A1}$ is assigned to the digit value 1, the output line $\overline{A2}$ is assigned to the digit value 2, the output line $\overline{A3}$ is assigned to the digit value 4, and the output line $\overline{A4}$ is assigned to the digit value 8.

With p = 1,3,5,7,9,11,13,15 and Z = 2,4,6,8,10,12 and 14, as the digit value of the output line $\overline{A1}$ is 1, and thus k = 1, the MOS transistor MS1 is connected to the non-inverting output Q of the first, third, fifth, etc. flip-flops.

The control input of the second MOS transistor is connected to the inverting output $\overline{Q}$ of the second, fourth, sixth, etc. flip-flops. The last flip-flop FF15 is connected to a first MOS transistor MS1 which is unable to form a series connection to a second MOS transistor MS2 as a following flip-flop is no longer present. In accordance with the above rule, in the case of the output line $\overline{A2}$, for the digit value 2, the first transistor MS1 is connected to the second, sixth, tenth, etc. flip-flops, and the second MOS transistor MS2 is connected to the fourth, eight, etc. flip-flops. The terminals of the control inputs of the MOS transistors for the remaining connection lines are likewise terminated in accordance with the above rules.

The binary number is emitted in inverted form on the output lines $\overline{A1}$ to $\overline{A4}$. If, for example, the quantity of charge eminating from the storage position ST contains eight unit charges, the first eight additional electrodes EZ0 and EZ are each provided with a unit charge, which charges are transmitted into the first seven additional diffusion zones DFZ1 to DFZ7 and the further additional diffusion zone DFZ0. Accordingly, the first seven flip-flops FF1 to FF7 are set, whereas the remaining flip-flops FF8 to FF15 are not set. The result is that the first three series circuits which are connected to the line $\overline{A1}$ do not facilitate a current flow as at least one of the MOS transistors is in each case blocked. The fourth series circuit which is connected to the flip-flop FF7 and the flip-flop $\overline{FF8}$ is, however, conductive as both the first MOS transistor MS1 and the second MOS transistor MS2 are in the conductive state. As a consequence, a current can flow from the opeating potential VDD via the resistor MR and the series circuit, and at the output of the line $\overline{A1}$ there appears a low potential which corresponds to a "0." With respect to the series circuits assigned to the output line $\overline{A2}$, the second series circuit which is connected to the flip-flops FF6 and FF8 is rendered conductive. The other series circuits and the last transistor MS1 are blocked. Accordingly, a low potential appears on the second output line $\overline{A2}$. This corresponds to a "0." In the case of the third output line $\overline{A3}$, the series circuit which is connected to the flip-flop FF4 and the flip-flop FF8, is driven conductive, whereas the individual transistor MS1 is blocked. As a result a low potential appears on this output line. This corresponds to a "0." The transistor MS1 of the fourth output line $\overline{A4}$ is blocked, however, as it is connected to the flip-flop FF8 which is not set. As a result, a high potential appears at the output line $\overline{A4}$. This corresponds to a "1." Therefore, the signal 1000 which, in inverted form, corresponds to the decimal number 7, can be withdrawn from the output lines $\overline{A1}$ to $\overline{A4}$. This result is correct as of the eight unit charges of the quantity of charge supplied by the storage position ST, the basic charge is not taken into consideration in the analysis. This basic charge is fed to the further diffusion zone DFZ0 which is conected to the operating potential VDD and is not taken into consideration in the further analysis.

Figure 3:
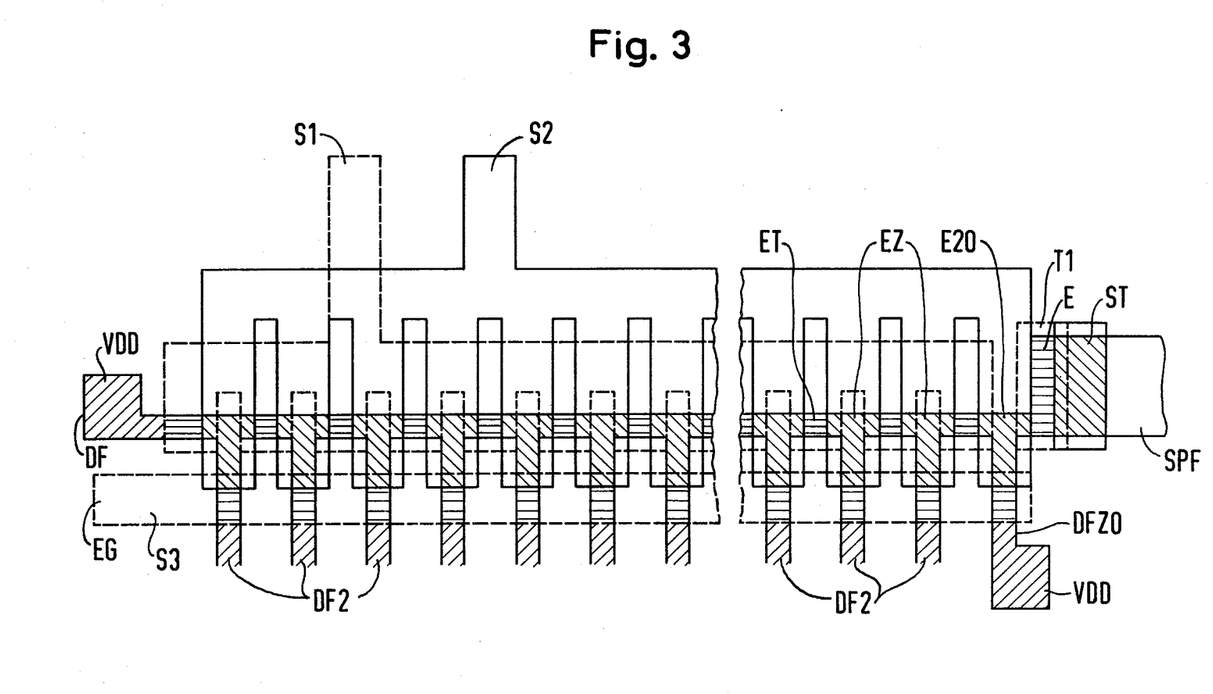
FIG. 3 illustrates a structural lay-out of a part of the evaluator circuit.

A lay-out of a part of the evaluator circuit can be obtained from reference to FIG. 3 which illustrates only the zone comprising the additional electrodes EZ and EZ0, the transfer electrodes ET, the surrender electrode EG and the additional diffusion zones DFZ and DFZ0. The shaded zones indicate those areas of the electrodes and diffusion zones which are electrically active. As the individual parts of the arrangement have been labeled as in the fundamental circuit diagram in FIG. 2, corrolation is readily apparent. Detailed explanations are therefore not required. The technological construction can take place in a known manner, e.g. in the double silicon technique. This is described in the book by Carlo H. Sequin and Michael F. Tompsett, "Charge Transfer Devices," published by the Academic Press, New York, San Francisco, London, 1975, page 19ff.

Figure 4:
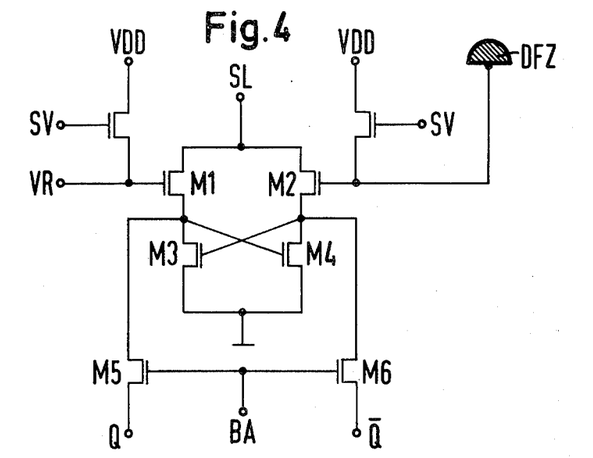
FIG. 4 illustrates a flip-flop which can be employed in the flip-flop circuit.

FIG. 4 illustrates a possible construction of a flip-flop FF. As this circuit does not constitute the subject matter of the invention it will not be explained in detail. It should suffice to say that with the aid of a timing signal SV, which is illustrated in its time position in FIG. 6, the potential at the control inputs of the MOS transistors M1 and M2 is set in dependence upon the reference voltage VR and the voltage of the additional diffusion zone DFZ. When the load timing signal SL is applied, the flip-flop triggers into the position governed by the voltage of the additional diffusion zone DFZ. The switching transistors M3 and M4 are set up accordingly. The position of the flip-flop is scanned with the aid of a timing signal BA connected to the transistors M5 and M6 and fed to the outputs Q and $\overline{Q}$.

Figure 5:
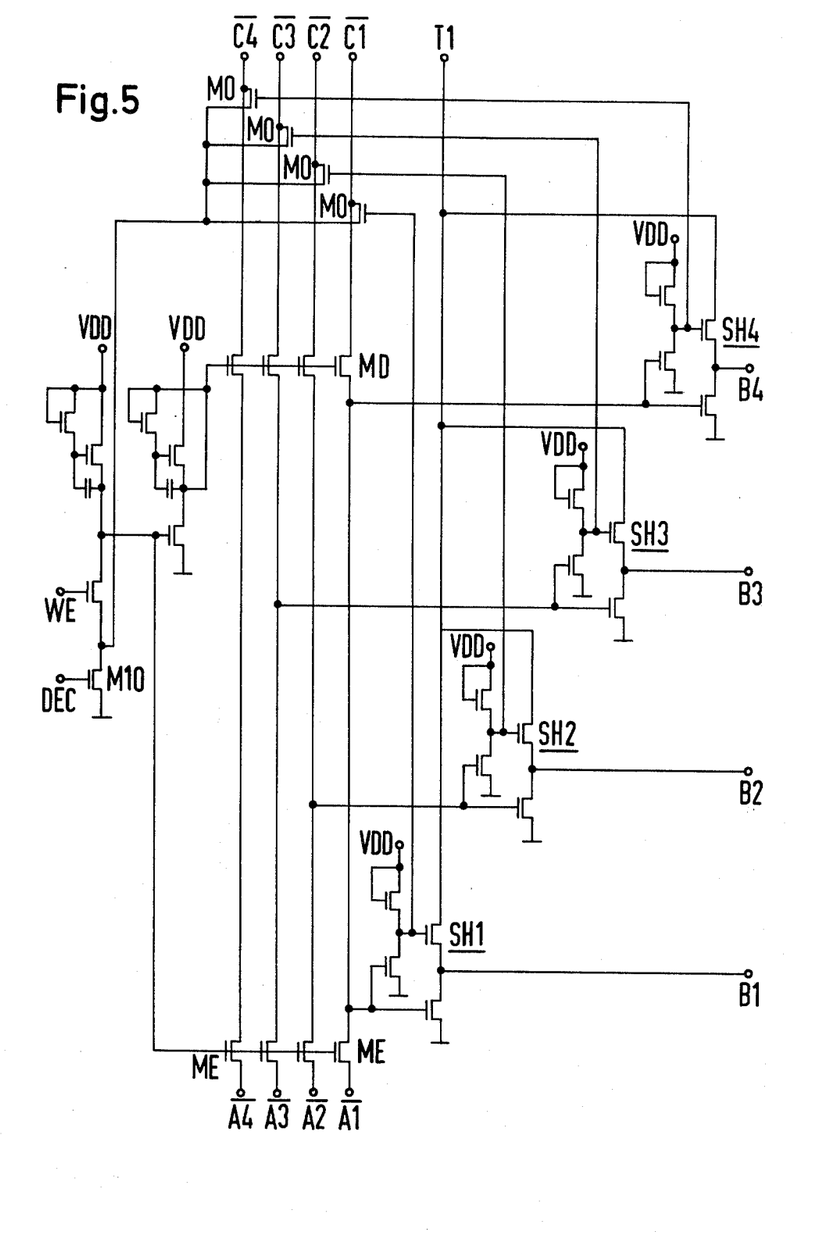
FIG. 5 shows a switching arrangement by which the output signals from an evaluator circuit can be switched through to the decoder circuit at the input of the CCD storage field.

A design for a switching arrangement SL can be obtained by reference to FIG. 5. The individual components are identical for the four lines $\overline{A1}$ to $\overline{A4}$ so that only the components assigned to a single line are described. The lines $\overline{A1}$ to $\overline{A4}$ are switched through to the lines B1 to B4 with the aid of switches SH1 to SH4. Here, the signal is inverted by the switches SH. In addition, it is possible to switch through the signals incoming on the lines $\overline{A1}$ to $\overline{A4}$ to the lines $\overline{C1}$ to $\overline{C4}$ and, in fact, by way of the MOS transistors MD.

The mode of operation of the switching arrangement SL will be briefly described in the following. If the information emanating from the lines $\overline{A1}$ to $\overline{A4}$ is to be regenerated and resupplied to the decoder circuit DC, thus to the lines B1 to B4, the signal DEC exhibits a low potential so that the transistor M10 is blocked. Therefore, a high potential prevails across the input transistors ME so that the latter are conductive and switch through the state of the lines $\overline{A1}$ to $\overline{A4}$ to the switches SH1 to SH4. At the same time the switches MD are blocked as a low potential prevails thereon. Consequently, the state of the lines $\overline{A1}$ to $\overline{A4}$ cannot be switched through to the lines $\overline{C1}$ to $\overline{C4}$. The switches SH1 to SH4 invert the signals on the lines $\overline{A1}$ to $\overline{A4}$, amplify these signals pulsed by the signal T1, and finally feed the signals to the lines B1 to B4 which are connected to the decoder circuit DC.

If an item of information is to be read out from the store, the signals on the lines $\overline{A1}$ to $\overline{A4}$ must be switched through to the lines $\overline{C1}$ to $\overline{C4}$. For this purpose, the signal input DEC receives a high potential and the signal input WE receives a low potential. Therefore, the switches ME are closed again, whereas the switches MD are opened. In dependence upon the signals on the lines $\overline{A1}$ to $\overline{A4}$, the switches MO are driven conductive or non-conductive. Accordingly, the line $\overline{C1}$ to $\overline{C4}$ can be discharged or not discharged by way of the switches MO.

On the write-in of an item of information, the signals at the inputs DEC and WE both exhibit a high potential. Accordingly, the switches ME are opened, whereas the switches MD are closed and the items of information on the lines $\overline{C1}$ to $\overline{C4}$ can pass to the switches SH1 to SH4.

Figure 6:
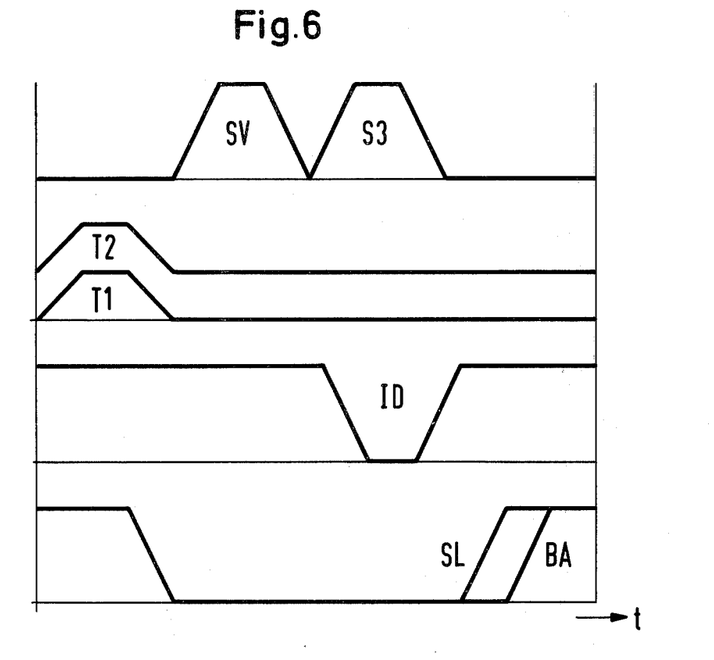
FIG. 6 is a pulse diagram showing voltage curves plotted with respect to time t.

The diagram in FIG. 6 indicates the time relationship of the timing signals T1, T2, SV, S3, BA and SL relative to one another. The diagram indicates the function, in particular, of the flip-flop illustrated in FIG. 4.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a charge coupled device storage module of the type having storage positions which are arranged in cascade and which are formed with the aid of electrodes arranged in insulated fashion above a semiconductor substrate, and of the type wherein, in respect of each storage position, an item of information incoming as a binary number and comprising n bits is stored in that a quantity of charge composed of i unit charges is stored in respect of each storage position, where i corresponds to the value of the binary number of the information, the improvement therein comprising:
   analysis means for analyzing the quantity of charge emanating from the last storage position of the cascade of storage positions including
   ($2^n - 1$) additional electrodes arranged in insulated fashion above the semiconductor substrate for connection to a first predetermined voltage, the surface of said additional electrodes and said first predetermined voltage dimensioned such that each of said additional electrodes stores one unit charge, so that with an incoming quantity of charge of i unit charges, the i additional electrodes which follow the last storage position each store one unit charge,
   a surrender electrode adjacent and common to said additional electrodes for receiving a surrender pulse train,
   ($2^n - 1$) diffusion zones isolated from one another in said semiconductor substrate and adjoining said surrender electrode, to which said unit charges stored by said additional electrodes can be transmitted, and
   an analysis circuit including a plurality of inputs connected to respective ones of said diffusion zones and a plurality of outputs, said analysis circuit responsive to the unit charges transmitted to said diffusion zones to emit a binary number at said outputs which corresponds with the number of unit charges transmitted to said diffusion zones.

2. The improved charge coupled device storage module of claim 1, comprising an additional diffusion zone at the end of said cascade of additional electrodes for receiving superfluous charge flow.

3. The improved charge coupled device storage module of claim 1 comprising a plurality of transfer electrodes connected to a second predetermined voltage and arranged between said additional electrodes to ensure that the quantity of charge exceeding a unit charge passes to adjoining one of said additional electrodes.

4. The improved charge coupled device storage module of claim 1, wherein said analysis circuit comprises:
   a flip-flop circuit including said inputs connected to said diffusion zones; and
   a coder circuit connected to said flip-flop circuit,
   said flip-flop circuit reading which additional diffusion zones have received a unit charge and said coder circuit producing the binary number assigned to the quantity of charge read by said flip-flop circuit.

5. The improved charge coupled device storage module of claim 4, wherein said flip-flop circuit comprises:
   ($2^n - 1$) flip-flops each having a first input connected to a respective diffusion zone and a second input connected to a reference potential which lies between the voltage assigned to a unit charge and the voltage to no unit charge.

6. The improved charge coupled device storage module of claim 5, comprising:
   means for producing said reference voltage including an additional diffusion zone in said semiconductor substrate connected to a current source, a first electrode connected to a first fixed voltage and arranged adjacent said additional diffusion zone, a second electrode connected to a second fixed voltage and arranged adjacent said first electrode, third and fourth electrodes which are arranged adjacent said second electrode and adjacent one another and each connected to receive a respective timing signal, a fifth electrode arranged adjacent said fourth electrode and connected to be driven by the surrender timing signal, and a further additional diffusion zone in said semiconductor substrate arranged adjacent said fifth electrode and to which a quantity of charge determined by the difference between the first and second fixed voltages and the size of the surfaces of said second electrode is transmitted and from which the reference voltage is withdrawn.

7. The improved charge coupled device storage module of claim 5 wherein said coder circuit has n output lines each assigned to one bit position of a binary number, a respective resistor connecting each of said output lines to an operating potential, a plurality of series circuits, each of said output lines connected to some of said plurality of series circuits each of said series circuits including first and second transistors, each of transistors including a control electrode, commencing from the flip-flops assigned to the additional electrodes which follow the last storage position, in accordance with the digit value k, the control electrode of said first transistor of the series circuit connected to the non-inverting output of the p · k-th flip-flop, where p = 1,3,5, etc., and the control electrode of the second transistor of a series circuit connected to the inverting output of the Z · k-th, adjacent flip-flop, where Z = 2,4,6 etc., and at the end of said chain of the flip-flops assigned to additional electrodes, and in the absence of a Z·k-th flip-flop only said first transistor connected to the p · k-th flip-flop is connected to the respective output line.

8. The improved charge coupled device storage module of claim 1, and further comprising a further additional electrode for receiving a basic charge, said further additional electrode arranged between the last storage position of the storage field and the first additional electrode for receiving a unit charge, and a further diffusion zone in said semiconductor substrate beneath said further additional electrode, said further diffusion zone connected to an operating potential for receiving the basic charge in response to energization of said surrender electrode.

* * * * *